(12) United States Patent  (10) Patent No.: US 7,709,358 B2
Guenter et al.  (45) Date of Patent: May 4, 2010

(54) INTEGRATED LIGHT EMITTING DEVICE AND PHOTODIODE WITH OHMIC CONTACT

(75) Inventors: James Guenter, Garland, TX (US); James R. Biard, Richardson, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/778,603

(22) Filed: Jul. 16, 2007

(65) Prior Publication Data

US 2007/0264805 A1   Nov. 15, 2007

Related U.S. Application Data

(62) Division of application No. 11/026,699, filed on Dec. 30, 2004, now Pat. No. 7,277,463.

(51) Int. Cl.
    *H01L 31/20* (2006.01)
(52) U.S. Cl. .................... 438/483; 438/23; 438/24; 257/184; 257/82
(58) Field of Classification Search ............... 438/483, 438/23, 24; 257/82, 50
    See application file for complete search history.

(56) References Cited

U.S. PATENT DOCUMENTS

| 4,179,702 A | 12/1979 | Lamorte |
| 5,365,536 A | 11/1994 | Seki |
| 5,475,701 A | 12/1995 | Hibbs-Brenner |
| 5,577,064 A | 11/1996 | Swirhun et al. |
| 5,625,636 A | 4/1997 | Bryan et al. |
| 5,666,376 A | 9/1997 | Cheng |
| 5,751,754 A | 5/1998 | Takagi |
| 5,943,357 A * | 8/1999 | Lebby et al. ............. 372/50.21 |
| 5,978,401 A | 11/1999 | Morgan |
| 6,392,256 B1 * | 5/2002 | Scott et al. .................. 257/184 |
| 6,487,230 B1 | 11/2002 | Boucart et al. |
| 6,707,027 B2 | 3/2004 | Liess et al. |
| 6,717,972 B2 | 4/2004 | Steinle et al. |
| 6,845,118 B1 | 1/2005 | Scott |
| 2001/0043629 A1 | 11/2001 | Sun et al. |
| 2002/0071464 A1 | 6/2002 | Coldren et al. |
| 2002/0110172 A1 | 8/2002 | Hasnain et al. |
| 2003/0021322 A1 | 1/2003 | Steinle et al. |
| 2005/0286593 A1 | 12/2005 | Guenter |

FOREIGN PATENT DOCUMENTS

| WO | WO0237124 | 5/2002 |
| WO | WO0237410 | 5/2002 |
| WO | WO0237411 | 5/2002 |
| WO | WO2006004606 | 1/2006 |

* cited by examiner

*Primary Examiner*—Matthew Smith
*Assistant Examiner*—Wilner Jean Baptiste
(74) *Attorney, Agent, or Firm*—Workman Nydegger

(57) ABSTRACT

Optoelectronic device including integrated light emitting device and photodiode. The optoelectronic device includes a light emitting device such as a vertical cavity surface emitting laser (VCSEL) or resonant cavity light emitting diode (RCLED). A photodiode is also included in the optoelectronic device. Between the light emitting device and the photodiode is a transition region. At least part of the transition region is shorted. A metal contact provides a contact to both the light emitting device and the photodiode.

16 Claims, 4 Drawing Sheets

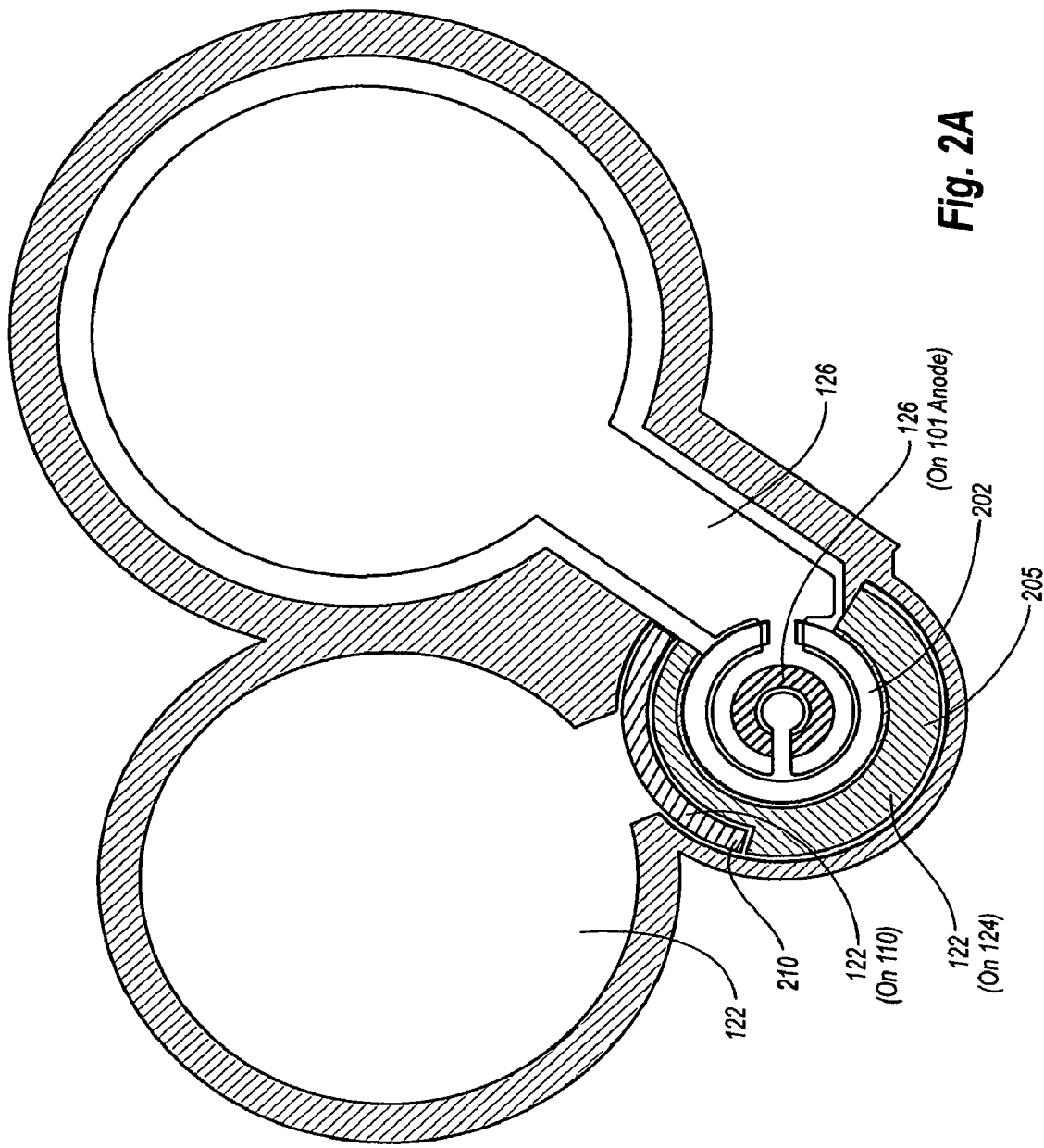

INTEGRATED LIGHT EMITTING DEVICE AND PHOTODIODE WITH OHMIC CONTACT

CROSS-REFERENCE TO RELATED APPLICATIONS

This application is a division of U.S. patent application Ser. No. 11/026,699, entitled INTEGRATED LIGHT EMITTING DEVICE AND PHOTODIODE WITH OHMIC CONTACT, filed Dec. 30, 2004 now U.S. Pat. No. 7,277,463, and incorporated herein in its entirety by this reference.

BACKGROUND OF THE INVENTION

1. The Field of the Invention

The invention generally relates to vertical cavity surface emitting lasers (VCSELs) and photodiodes. More particularly, the invention relates to VCSELs and photodiodes fabricated in a monolithic structure.

2. Description of the Related Art

Lasers have become useful devices with applications ranging from simple laser pointers that output a laser beam for directing attention, to high-speed modulated lasers useful for transmitting high-speed digital data over long distances. Several different types of lasers exist and find usefulness in applications at the present time. One type of laser is the edge emitter laser which is formed by cleaving a diode from a semiconductor wafer. Cleaving a diode from a semiconductor wafer forms mirrors that form a laser cavity defined by the edges of the laser diode. Edge emitter lasers may be designed to emit a laser beam more strongly from one of the edges than the other edges. However, some laser energy will be emitted at the other edges. Edge emitter lasers are commonly used when high optical power is needed.

A second type of commonly used laser is known as a vertical cavity surface emitting laser (VCSEL). A VCSEL is formed in part by forming a first mirror from Distributed Bragg Reflector (DBR) semiconductor layers. The DBR layers alternate high and low refractive indices so as to create the mirror effect. An active layer is then formed on the first mirror. A second mirror is formed on the active layer using more DBR semiconductor layers. Thus the VCSEL laser cavity is defined by top and bottom mirrors which causes a laser beam to be emitted from the surface of the laser. Laser diodes generally operate using a forward bias. To forward bias a laser diode, a voltage is applied to the anode and a lower voltage or ground is connected to the cathode.

In some simple applications, the lasers may be operated open loop. I.e., the lasers do not require feedback, or can operate satisfactorily without feedback. For example, in most laser pointer applications, the output power of the laser beam may be controlled without reference to the actual output power. In other applications, it may be very important to precisely gauge the amount of output power emitted by the laser while it is operating. For example, in communications applications it may be useful to know the output power of the laser such that the output power of a laser may be adjusted to comply with various standards or other requirements.

Many applications use a laser in combination with a photodiode or other photosensitive device to control the output of the laser. A photodiode has a current output that is proportional to light impinging on the diode. The photodiode either has no bias or is implemented in a reverse bias configuration such that the cathode is connected to a high voltage while the anode is connected to a low voltage or ground. In a photodiode in the reverse biased or unbiased configuration, current is generated within the photodiode as light impinges the photodiode.

An appropriately placed photodiode may be used as one element in the feedback circuit for controlling the laser. For example, a photodiode used in an edge emitter laser application may be placed on one of the two active edges of the edge emitter laser diode. While the power output at each of the active edges may be different, the power at each active edge is proportional by some factor to the power output at the other active edges on an edge emitter laser diode. Similarly, the photodiode may be used to monitor the output power from other types of lasers.

Optical output is normally available only from one surface of a VCSEL. Thus, the use of a photodiode to monitor the VCSEL output requires that a portion of the optical output from the VCSEL be diverted so as to impinge on the photodiode. For example, this function may be implemented by reflecting light from the exit window on the VCSEL package. The exit window may be flat or slanted. With a flat window package the VCSEL may be mounted on top of the monitor photodiode. With a slant window package the VCSEL and photodiode are mounted side by side. However, accurate control of the angle and reflectivity of the slanted window and accurate placement of the two devices are important to achieve predictable coupling. This requirement for precise control of both package and mounting tolerance of the VCSEL and photodiode results in an increase in cost.

When using a monitor photodiode it is important that the photodiode current be proportional to the output power from the VCSEL that is coupled to the optical fiber for all bias currents and over temperature. This ratio of photodiode current to coupled power is called tracking ratio.

Various challenges exist when implementing a laser diode and photodiode together. While the laser diode and photodiode are both formed from semiconductors and use similar construction techniques, they are often made from different materials and they have generally been implemented as separate devices. This necessitates a different power supply be used for biasing the laser diode and photodiode when they are biased using opposite polarities. Using two discrete components, further, results in an increase of cost.

Attempts have been made to integrate the laser diode and photodiode monolithically on a single wafer substrate. However, this may still require the use of different power supplies. For example, in the case when the laser diode and photodiode share a common cathode or anode. Additionally, the photodiode may be placed on top of the VCSEL or within a mirror that is part of the VCSEL. This however has the unfortunate drawback of causing the photodiode to become a part of the optics, particularly the mirror, of the laser thus altering the optical characteristics of the laser.

Therefore, what would be advantageous are mechanisms for implementing laser diodes and photodiodes monolithically using a single power supply.

BRIEF SUMMARY OF THE INVENTION

One embodiment of the invention includes an optoelectronic device. The optoelectronic device includes a vertical cavity surface emitting laser (VCSEL). The VCSEL includes a top mirror, an active region below the top mirror, and a bottom mirror. A transition region is formed below the bottom mirror of the VCSEL. A photodiode is connected to the transition region. A metal contact is formed so as to short out a portion of the transition region and to provide an Ohmic contact to the VCSEL and photodiode.

Another embodiment of the invention includes a method for manufacturing optoelectronic devices. A photodiode is formed on a substrate. A transition region is formed on the photodiode. A VCSEL is formed on the transition region. Ohmic contacts are formed so as to short at least part of the transition region to create an optoelectronic device with a common contact to both the photodiode and VCSEL.

One embodiment of the invention includes an optoelectronic device. The optoelectronic device includes a light emitting diode (LED). A transition region is connected to the light emitting diode. A photodiode is connected to the transition region. A portion of the transition region is shorted using a metal contact. This provides an Ohmic contact to the LED and the photodiode.

Some embodiments of the invention allow for a single structure that includes both a VCSEL laser diode and a photodiode. Further, because of the particular construction of these embodiments, a single power supply, as opposed to a positive and negative supply, can be used to power both VCSEL and photodiode biasing circuits.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 2A illustrates a top view of contacts on an optoelectronic device

DETAILED DESCRIPTION OF THE INVENTION

One exemplary embodiment includes an optoelectronic device including a VCSEL and integrated photodiode. A transition region is configured between the VCSEL and integrated photodiode. One function of the transition region is to provide a region where P and N type layers can be alternated such that a proper coaxial alignment of layers can be accomplished. Metal Ohmic contacts are then connected such that at least a portion of the transition region can be shorted. Thus, in one embodiment, a monolithic three terminal device may be fabricated that includes both a VCSEL and a coaxially aligned photodiode. The VCSEL and photodiode are electrically connected at a common terminal, although they are separated by the transition region. This allows the VCSEL to be forward biased and the photodiode to be reverse biased using a single voltage power supply.

Figure 1:
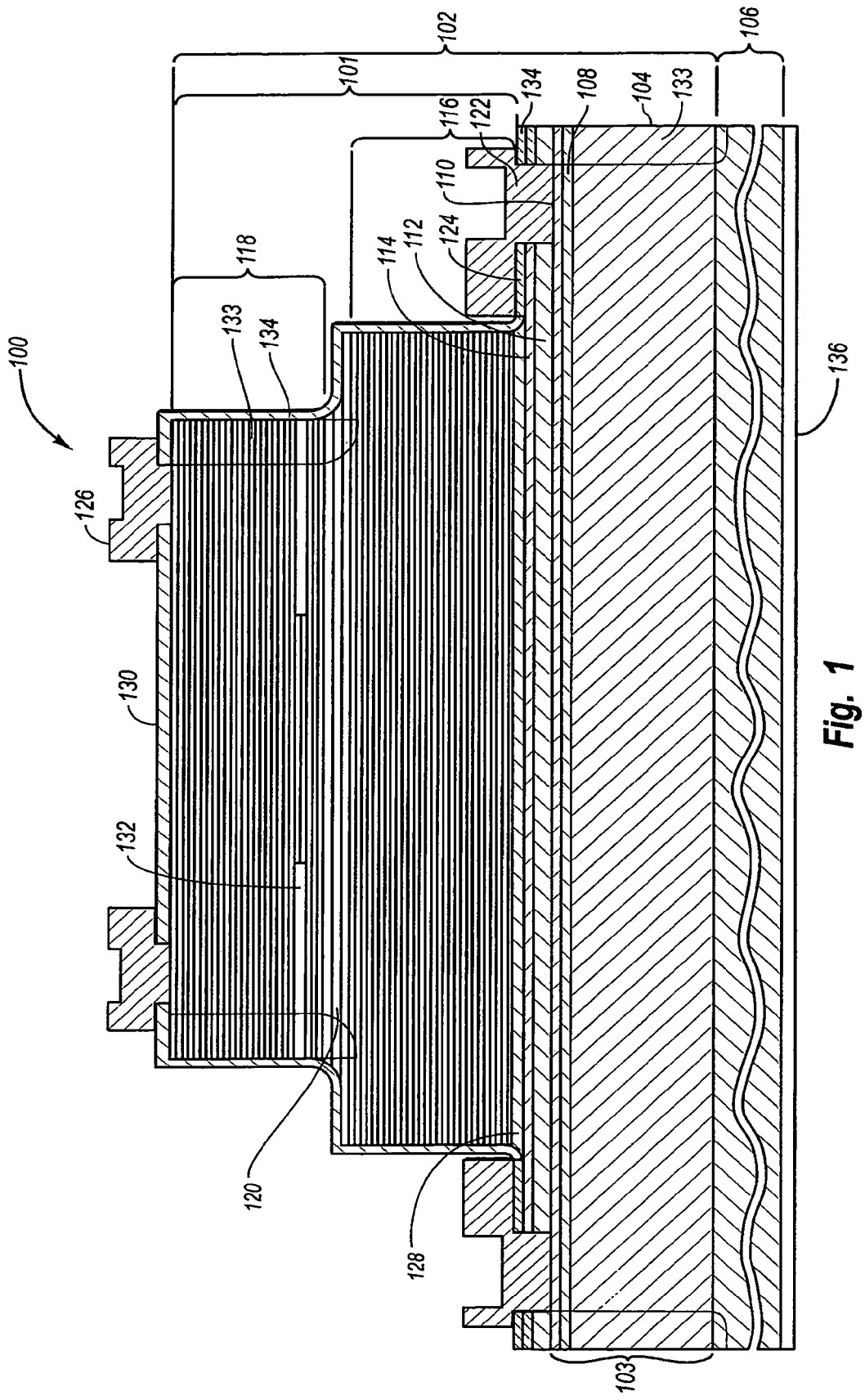
FIG. 1 illustrates an optoelectronic device including a processed epitaxial structure including a VCSEL and integrated photodiode.
Figure 2B:
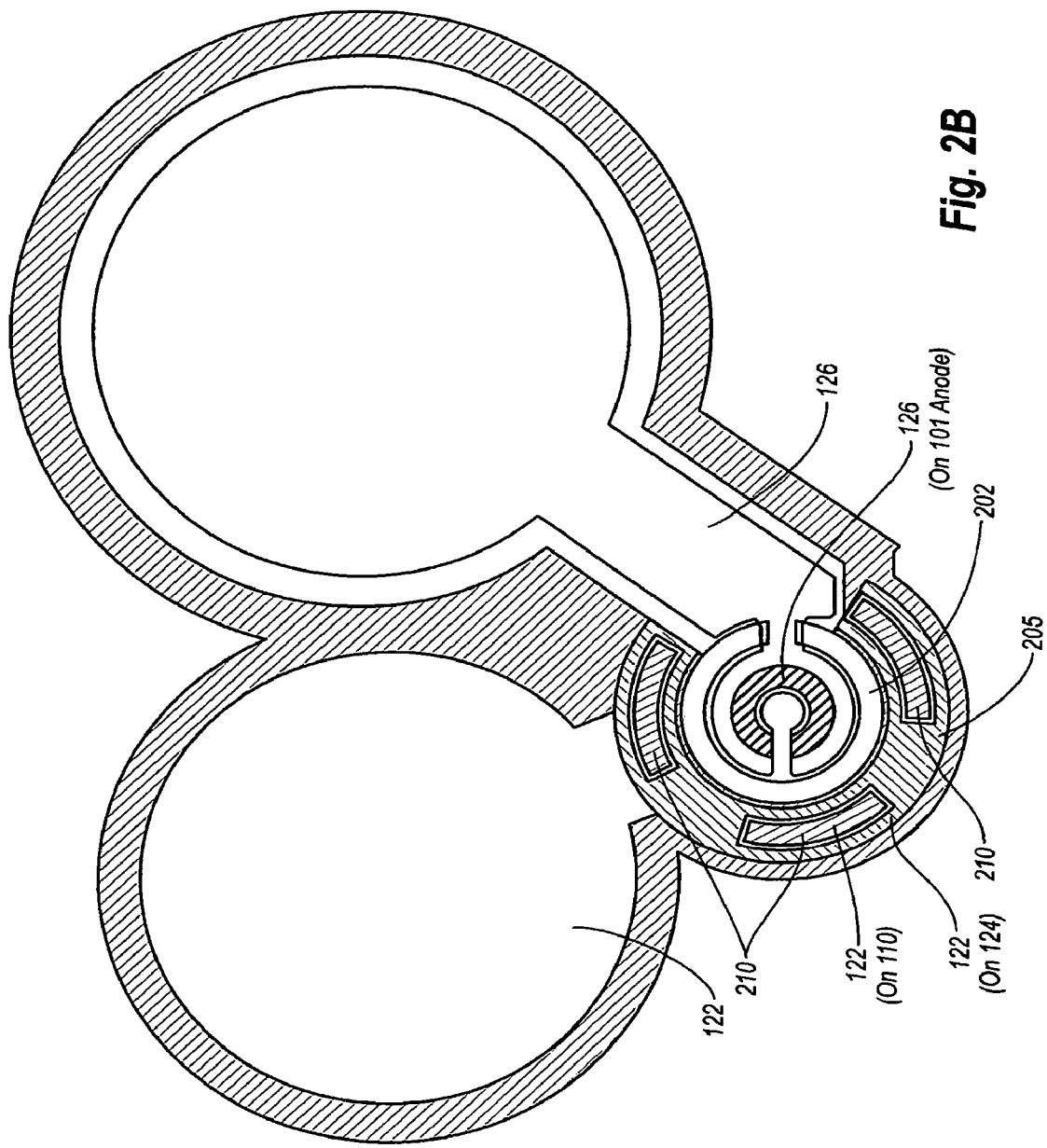
FIG. 2B illustrates a top view of contacts on an optoelectronic device
Figure 2C:
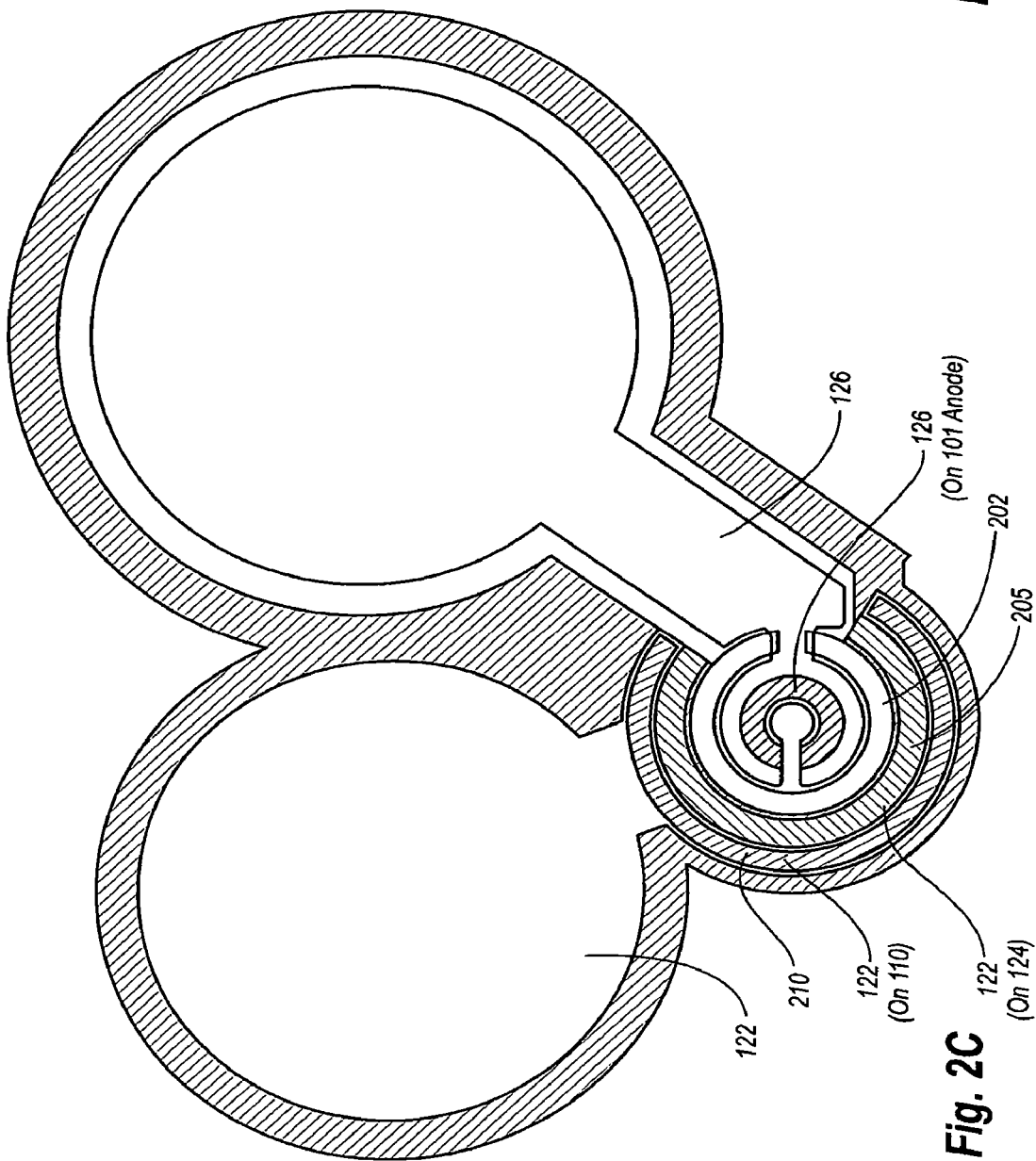
FIG. 2C illustrates a top view of contacts on an optoelectronic device.

Referring now to FIG. 1, one embodiment is illustrated as an optoelectronic device 100 that includes a VCSEL 101 and integrated photodiode 103. The optoelectronic device 100 is fabricated from an eptiaxial structure 102 grown on a substrate 106. Various lithographic steps can be utilized to form the processed epitaxial structure 102 as shown.

The VCSEL 101 includes a top mirror 118, an active region 120 and a bottom mirror 116. The top mirror 118 is a distributed Bragg reflector (DBR) that generally comprises a number of alternating layers with high and low indexes of refraction. This creates a mirror with high reflectivity, in excess of 99%. In the example shown, the top mirror is constructed of a P type material such as carbon doped Gallium Arsenide (GaAs). The top mirror 118 includes about 20 mirror periods where each period includes a high index of refraction layer and a low index of refraction layer. The index change is created by changing the ratio of aluminum and gallium in the AlGaAs.

The active region 120 includes a number of quantum wells for stimulating the emission of laser energy. In the embodiment shown, the AlGaAs active region 120 is one wavelength ($\lambda$) of the laser light in the high-index semiconductor. For an 850 nm VCSEL the effective index of refraction in the active layer is about 3.4 so the active layer thickness is about 250 nm. However, active regions in a range from $\lambda$ to $4\lambda$ may be used.

Below the active region is a bottom mirror 116. The bottom mirror 116 is also a DBR mirror comprised of about 30 to 35 doped N type AlGaAs mirror periods. Silicon is one example of a dopant that may be used in the bottom mirror.

A spacer layer 128 S/R is formed below the bottom mirror 116. The spacer layer 128 is preferably about $5\lambda/4$ or $7\lambda/4$ where $\lambda$ is the wavelength of light that the VCSEL 101 is designed to emit. However, the spacer layer 128 may be any odd integral multiple of the wavelength (i.e., $$\frac{\lambda(1+n)}{4}$$

where n is an integer). Accordingly, the spacer layer can account for non-uniformities that may occur in processing various layers of the epitaxial structure 102. In some embodiments, the spacer layer 128 is sufficiently thick such that when etching is done to the spacer layer 128 the deepest non-uniformities do not go all the way through the spacer layer 128 and yet the shallowest potions reach the spacer layer 128. One goal of processing, therefore is to expose the spacer layer 128 without going all the way through the spacer layer 128 at any point. Subsequent processing uses a selective etchant such as dilute hydrofluoric acid ("HF") to uniformly expose the layer underlying the spacer layer 128.

The epitaxial structure 102 includes a photodiode absorption layer 104 formed on a wafer substrate 106. The wafer substrate 106 in this example is heavily doped n-type GaAs. Other III V semiconductor materials may also be used in other embodiments. The photodiode absorption layer 104 in this example is an N doped material such as GaAs doped with silicon. In response to photons striking the absorption layer 104, a current is produced in the photodiode. In one embodiment the absorption layer 104 is doped to a donor concentration of less than $1 \times 10^{15}$ cm$^{-3}$ to minimize capacitance and maximize photodiode response to light.

In the example shown, a heavily doped P+ Aluminum Gallium Arsenide (AlGaAs) layer 108 is on the absorption layer 104. The heavily doped P+ AlGaAs layer 108 may be used as at least a portion of the P type material used in fabricating the PN junction of the photodiode. The P+ AlGaAs layer 108 is optional, and may be used to reduce the resistance of the photodiode 103. In some embodiments, the P+ AlGaAs layer 108, has an aluminum composition of 15%-35% Aluminum Arsenide (AlAs). This optional layer if used has a thickness of <$\lambda$/4 as described below. The wavelength of the VCSEL is $\lambda$.

A P+ GaAs layer 110 is formed on the optional P+ AlGaAs layer 108. The P+ GaAs layer 110 forms the anode of the photodiode. The layer 110 is exposed by a subsequent etching step and used to make Ohmic contact to the anode of the photodiode. Specifically, a stop etch, such as dilute HF, can be used to etch through an AlGaAs layer 112 (described in more detail below) and stop on the P+GaAs layer 110. As described below, it may be desirable that layers below the bottom mirror 116 of the VCSEL be fabricated to act as an extension of the bottom mirror.

One technique for fabricating layers below a bottom mirror as an extension of the bottom mirror includes making the layers below the bottom mirror 116 $\lambda$/4, i.e. ¼ of the wavelength of the light that the laser is designed to emit. However, it may be desirable in some embodiments to form the P+ GaAs layer 110 at a thickness less than $\lambda$/4 of the wavelength of light. Lesser thicknesses of the P+ GaAs layer 110 lessens the optical absorption in that layer and therefore increases the responsivity of the photodiode 103. The P+ GaAs layer 110 can be augmented with the optional P+ $Al_{0.15}Ga_{0.85}As$ layer 108 to bring the combined optical thickness of the P+ GaAs layer 110 and layer 108 to $\lambda$/4.

An optional AlGaAs layer 112 may be formed on the P+ GaAs layer 110 to facilitate processing. The optional AlGaAs layer 112 can be $\lambda$/4 or ¼ of the wavelength of light that the VCSEL is designed to emit. This allows the AlGaAs layer 112 to function as a portion of the N type DBR mirror 116 of the VCSEL 101. The doping of the AlGaAs layer 112 may be any doping, i.e., undoped, P type doping or N type doping. Using the AlGaAs layer 112 in the epitaxial structure allows a dilute HF etchant to be used to etch through the AlGaAs layer 112 and stop on the P+ GaAs layer. The AlGaAs layer 112, can be an aluminum composition of 85%-100% AlAs. The composition may be selected to optimize selective etch processes used in etching the AlGaAs layer 112.

Formed on the AlGaAs layer 112 is an N+ GaAs layer 114. When the optional AlGaAs layer 112 is not employed the N+ GaAs layer 114 is formed on the P+ GaAs layer 110. The N+ GaAs layer 114 can be $\lambda$/4 or ¼ of the wavelength of light that the VCSEL is designed to emit. As with the AlGaAs layer 112, the N+ GaAs layer 114 may be used as a portion of the N type DBR mirror 116 of the VCSEL 101. By heavily doping the N+ GaAs layer 114, the Burstein shift effect causes a reduction in the absorption coefficient at the wavelength of light that the VCSEL is designed to emit. This reduction in the absorption coefficient helps to reduce optical absorption and in turn increases the light that reaches the photodiode. The surface of the N+ GaAs layer 114 is exposed by the stop etch used to etch through the AlGaAs layer 117 as described above. The N+ GaAs layer 114 is used as the cathode contact to the VCSEL.

Metal depositions 122, 124 are used to short at least a portion of a transition region and/or to form an Ohmic contact. In this example, the transition region includes the N+ GaAs layer 114 and the AlGaAs layer 112. One of the metal depositions is a Gold Germanium (Au:Ge) alloy deposition 124. Au:Ge metal deposition is well suited for use with N doped materials. Thus, the Au:Ge deposition 124 is deposited on the N+ GaAs layer 114. The other metal deposition is a Titanium Gold (Ti:Au) alloy deposition 122. Ti:Au alloy deposition are well suited for use with P doped materials. Thus, in the present example, the Ti:Au deposition 122 is coupled to the P+ GaAs layer 110 and the Au:Ge deposition 122. Accordingly, the Ti:Au deposition 122 makes Ohmic contact to the photodiode 103 anode and the Au:Ge deposition 124 which forms a VCSEL 101 cathode Ohmic contact. A top contact 126 formed from Ti:Au forms an Ohmic contact to the VCSEL 101 anode. The top contact 126 and Ti:Au deposition 122 may be completed in the same metal deposition and lithographic steps as described below.

Still referring to FIG. 1, several modifications will be described. For example, the epitaxial structure may be constructed by omitting one or both of the AlGaAs layer 112 and the P+ AlGaAs layer 108. When the AlGaAs layer 112 is not included, the combined thickness of the N+ GaAs layer 114 and the P+ GaAs layer 110 is preferably $\lambda$/4 and the P+ AlGaAs layer 108 is preferably $\lambda$/4. This provides one mirror period for the bottom mirror 116. When the AlGaAs layer 112 is used and the AlGaAs layer 108 is omitted there is no mirror extension restriction on the combined optical thickness of the N+ GaAs layer 114 and the P+ GaAs layer 110 but the AlGaAs layer 112 is preferably $\lambda$/4. In this embodiment the surface of the P+ GaAs layer 110 is exposed with a timed etch rather than a stop etch. When both optional layers 112 and 108 are omitted there is no mirror extension restriction on the combined optical thickness of layers 114 and 110. When either or both of the optional AlGaAs layer 112 and the P+ AlGaAs layer 108 are used as an extension of the N mirror the number of periods in the N mirror periods may be adjusted to achieve the desired N mirror reflectivity.

While for purposes of FIG. 1, the VCSEL 101 and photodiode 103 are shown as including certain elements of the epitaxial structure 102 and other elements, more or fewer components may be included in the VCSEL 101, photodiode 103 and other components. For example, a reference to the VCSEL 101 may, or may not depending on the context, also include the Ohmic contacts formed by the Ti:Au layer 122 and the Au:Ge layer 124. Likewise, a reference to the photodiode 103 may, or may not depending on the context, also include the Ohmic contacts formed by the Ti:Au layer 122 and the Au:Ge layer 124.

The mesa 202 includes the portions of the epitaxial structure 102 that form the VCSEL 101. The mesa 202 is formed by etching around the VCSEL 101 as will be described in more detail below. It may also be desirable that the VCSEL cathode contact area 205 cover a majority of the area around the perimeter of the mesa 202. The photodiode 103 series resistance may be higher than that of the VCSEL 101 without jeopardizing performance. Thus, the photodiode contact area 210 may occupy a more minor portion of the area around the perimeter of the mesa 202.

Figure 3:
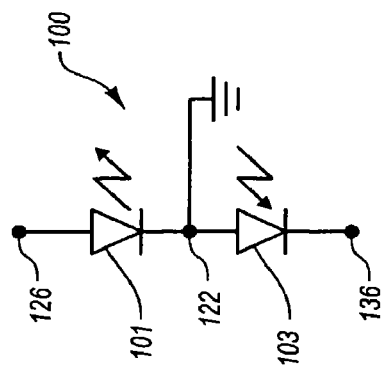
FIG. 3 illustrates a schematic view of the optoelectronic device shown in FIG. 1.

Referring now to FIG. 3, a schematic representation of the optoelectronic device is illustrated. Schematically, the optoelectronic device includes a VCSEL 101 and a photodiode 103. The VCSEL 101 and photodiode 103 are interconnected by an Ohmic contact illustrated schematically at 122. Thus a single supply voltage may be used to bias both the VCSEL 101 and the photodiode 103. The high supply voltage is applied to the VCSEL anode node 126 and the photodiode cathode node 136. Ground, or a low supply voltage can be applied to node 122.

With reference again to FIG. 1, various lithographic acts will be described where such acts are used to create the optoelectronic device 100 shown in FIG. 1. The first act in the creation of an optoelectronic device 100 is growing an appropriate epitaxial structure 102. The epitaxial structure 102 includes the wafer substrate 106, the N doped photodiode absorption layer 104, the P+ AlGaAs layer 108, the P+ GaAs layer 110, the AlGaAs layer 112, the N+ GaAs layer 114, an AlAs spacer 128, the bottom DBR mirror 116 of the VCSEL 101, the active region 120 of the VCSEL 101, and the top mirror 118 of the VCSEL 101.

To form the optoelectronic device 100 as it appears in FIG. 1, various photolithographic acts are performed on the epitaxial structure 102. An oxide layer, which is a portion of the protective oxide 130, is deposited (S/R). In the example shown, the oxide layer is λ/4 of $SiO_2$. A top mirror mask is used to protect portions of the oxide layer from etching. A $SiO_2$ etch is then used to remove portions of the $SiO_2$ layer not protected by the top mirror mask. Etching is further done in these non protected areas to etch to a layer below where an oxide aperture will be grown into the VCSEL 101. The oxide aperture 132 is then grown into the VCSEL 101. The oxide aperture 132 is useful for directing current flow in the VCSEL 101.

A reactive ion etch (RIE) etch mask is used to protect portions of the epitaxial structure 102. Unprotected portions of the epitaxial structure 102 are then etched down to the AlAs spacer 128. A stop etch is then used to etch through the AlAs spacer 128 to the N+ GaAs layer 114. A Au:Ge liftoff mask is then used to define a region where the Au:Ge deposition 124 can be deposited on the N+ GaAs layer.

FIG. 1 shows a stop etch can be used to selectively remove portions of the N+ GaAs layer 114. Another etch, such as dilute HF, can be used to etch through the AlGaAs layer 112 for etch to expose the P+ GaAs layer 110. Alternatively, a timed etch may be used when the AlGaAs layer 112 is not used.

An isolation mask is used to define regions where an isolation implant can be used to separate each optoelectronic device 100 on a wafer from other optoelectronic devices. The isolation implant 133 is implanted using the isolation mask.

A second $SiO_2$ layer is grown on the epitaxial structure. The second $SiO_2$ layer increases the protective oxide to λ/2 at the oxide layer 130. A second protective layer 134 that is λ/4 is formed from the second $SiO_2$ layer around other parts of the epitaxial structure 102.

Portions of the second $SiO_2$ layer are removed using a second $SiO_2$ etch mask. This allows Ti:Au to be deposited using a Ti:Au Liftoff mask. This allows for the formation of the Ti:Au layer 122 as a part of an Ohmic contact. The topside contact 126 is also formed using this deposition of Ti:Au. A separate Au:Ge deposition may be used to form a contact on the bottom side of the wafer 106 to form the cathode contact 136 to the photodiode.

Various modifications to the above method may be made within the scope of embodiments claimed herein. For example, the AlGaAs layer 112 is an optional layer. Thus to remove portions of the N+ GaAs layer 114 when the AlGaAs layer 112 is not used, a timed etch may be used. Additionally, as it is desirable in some applications to maintain a constant number of mirror periods, the number of mirror periods grown on the bottom mirror 116 is a function of whether or not the AlGaAs layer and/or the P+ AlGaAs layers are used. For example, when these layers are not used, additional mirror periods may be added to the bottom mirror 116.

Using an epitaxial structure with only an N+ GaAs layer 114 and a P+ GaAs layer 110 may be useful when there is a desire to process a structure that was originally intended for use in coupling a VCSEL and a photodiode using a tunnel junction. Such an implementation is described in U.S. patent application titled LIGHT EMITTING DEVICE WITH AN INTEGRATED MONITOR PHOTODIODE filed on Jun. 25, 2004, Ser. No. 10/877,915 and incorporated herein by reference. By varying the types of etching that are used and by appropriately depositing metal for contacts, an optoelectronic device with tunnel junction materials can be fabricated as an optoelectronic device with an Ohmic contact. Advantageously, some embodiments of the invention allow for a single power supply to be used to power both the VCSEL and photodiode.

While the above description has been framed in the context of VCSEL diodes, other light generating devices may also be used. For example, a resonant cavity light emitting diode (RCLED) may be used as a light generating device in place of the VCSEL diodes.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A method of manufacturing an optoelectronic device that includes an integrated VCSEL and photodiode, the method comprising:
    forming a photodiode on a substrate;
    forming a transition region on the photodiode;
    forming a VCSEL on the transition region; and
    forming a first Ohmic contact on the VCSEL and forming a second Ohmic contact on the photodiode so as to short at least a portion of the transition region, wherein one of the first and second Ohmic contacts is electrically coupled to a cathode and the other of the first and second Ohmic contacts is electrically coupled to an anode.

2. The method of claim 1, wherein forming a photodiode and forming a transition layer comprise:
    forming an N type absorption layer on a substrate;
    forming a P+ GaAs or AlGaAs layer on the N type absorption layer;
    forming a P+ GaAs layer on the P+ AlGaAs layer;
    forming a GaAs or AlGaAs layer on the P+ GaAs layer; and
    forming an N+ GaAs layer on the AlGaAs layer.

3. The method of claim 2, wherein forming a wherein forming Ohmic contacts on the optoelectronic device comprises:
    etching to the N+ GaAs layer and depositing a Au:Ge contact on the N+ GaAs layer; and
    etching to the P+ GaAs layer and depositing a Ti:Au contact on the Au:Ge contact and the P+ GaAs layer.

4. The method of claim 1, wherein etching to the P+ GaAs layer comprises;
    etching away the N+ GaAs layer using a first stop etch; and
    etching away the AlGaAs layer using a second stop etch.

5. The method of claim 4, wherein the first stop etch is citric acid and the second stop etch is dilute hydrofluoric acid.

6. The method of claim 1, wherein etching to the P+ GaAs layer comprises;
    etching away the N+ GaAs layer using a first timed etch; and
    etching away the AlGaAs layer using a second timed etch.

7. The method of claim 1, wherein forming an absorption layer and forming a transition layer comprise:
    forming an N type absorption layer on a substrate;
    forming a P+ GaAs layer on the N type absorption layer; and,
    forming an N+ GaAs layer on the P+ GaAs layer.

8. The method of claim 7, wherein forming Ohmic contacts on the optoelectronic device comprises:
   etching to the N+ GaAs layer using a timed etch and depositing a Au:Ge contact on the N+ GaAs layer; and
   etching to the P+ GaAs layer using a timed etch and depositing a Ti:Au contact on the Au:Ge contact and the P+ GaAs layer.

9. The method of claim 1, wherein the entire transition region is formed over at least a portion of the photodiode.

10. The method of claim 1, wherein the entire VCSEL is formed over the transition region.

11. The method of claim 1, wherein the first Ohmic contact is coupled to a cathode of the VCSEL and the second contact is coupled to an anode for the photodiode.

12. The method of claim 1, wherein the VCSEL includes a third contact that is electrically coupled to the photodiode, the method further comprising applying power to the first and third contacts using a single power supply.

13. The method of claim 12, wherein the single power supply is a high voltage power supply.

14. The method of claim 13, further comprising applying a low voltage power to the second Ohmic contact.

15. A device manufactured according to the method of claim 1.

16. A method of manufacturing an optoelectronic device that includes an integrated VCSEL and photodiode, the method comprising:
   forming a photodiode on a substrate;
   forming a transition region on the photodiode;
   forming a VCSEL on the transition region; and
   forming a first Ohmic contact on the cathode of the VCSEL; and
   forming a second Ohmic contact on the anode of the photodiode, the first and/or second Ohmic contacts providing a short of at least a portion of the optoelectronic device.

* * * * *